(12) United States Patent
Kihara et al.

(10) Patent No.: US 6,962,756 B2
(45) Date of Patent: Nov. 8, 2005

(54) TRANSPARENT ELECTRICALLY-CONDUCTIVE FILM AND ITS USE

(75) Inventors: Shuta Kihara, Hiratsuka (JP); Hiroki Oguro, Hiratsuka (JP); Ko Kedo, Hiratsuka (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 10/284,370

(22) Filed: Oct. 31, 2002

(65) Prior Publication Data

US 2003/0104232 A1 Jun. 5, 2003

(30) Foreign Application Priority Data

| Nov. 2, 2001 | (JP) | ........................ 2001-337840 |
| Nov. 30, 2001 | (JP) | ........................ 2001-366316 |
| Sep. 17, 2002 | (JP) | ........................ 2002-270383 |

(51) Int. Cl.[7] .................... H05B 33/12; B32B 27/28
(52) U.S. Cl. .............. 428/690; 428/411.1; 252/301.16; 313/504; 313/506
(58) Field of Search ................. 428/690, 917, 428/411.1, 473.5; 313/504, 506; 252/301.16; 528/353

(56) References Cited

U.S. PATENT DOCUMENTS

| 4,879,059 A | * 11/1989 | Hanyu et al. | ............... 428/1.26 |
| 5,053,480 A | * 10/1991 | Koto et al. | ................. 528/188 |
| 5,072,262 A | * 12/1991 | Uekita et al. | ................ 257/410 |
| 5,614,607 A | * 3/1997 | Hay et al. | ................... 528/353 |
| 5,667,853 A | * 9/1997 | Fukuyoshi et al. | ........ 428/1.62 |
| 5,929,562 A | * 7/1999 | Pichler | ....................... 313/506 |
| 6,226,067 B1 | * 5/2001 | Nishiguchi et al. | ......... 349/155 |
| 6,486,932 B1 | * 11/2002 | Nakao et al. | ................. 349/89 |
| 6,497,969 B2 | * 12/2002 | Kim et al. | .................. 428/690 |
| 6,498,226 B2 | * 12/2002 | Cheng et al. | ............... 528/170 |

FOREIGN PATENT DOCUMENTS

| JP | 6-251632 | 2/1993 |
| JP | 6-44826 | 2/1994 |
| JP | 9-116158 | 5/1997 |
| JP | 9-169074 | 6/1997 |
| JP | 10-270711 | 10/1998 |
| JP | 2001-52530 | 2/2001 |

* cited by examiner

*Primary Examiner*—Rena Dye
*Assistant Examiner*—Carnie S. Thompson
(74) *Attorney, Agent, or Firm*—Wenderoth, Lind & Ponack, L.L.P.

(57) ABSTRACT

A transparent electrically-conductive film comprising a substrate made of an aliphatic polyimide having a repeating unit of the formula [I] and a transparent electrically-conductive thin film layer, the transparent electrically-conductive thin film layer being provided on the substrate,

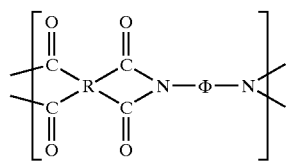

[I]

wherein R is a tetravalent aliphatic group having 4 to 39 carbon atoms and Φ is a divalent aliphatic group having 1 to 39 carbon atoms or a divalent aromatic group having 6 to 39 carbon atoms;

an organic EL element using the above film; a thin-film transistor substrate comprising a substrate formed of a film of a polyimide having a repeating unit of the formula [I] and, provided thereon, a thin-film transistor; and an organic EL element using the above transistor substrate.

11 Claims, 3 Drawing Sheets

TRANSPARENT ELECTRICALLY-CONDUCTIVE FILM AND ITS USE

FIELD OF THE INVENTION

The present invention relates to a transparent electrically-conductive film using a poylimide excellent in transparency and heat resistance and its use. More specifically, it relates to a transparent electrically-conductive film used for an electro-optical device such as a transparent substrate of a liquid crystal display element or an organic EL display element and a tranparent electrode of a touch panel; an organic EL element obtained by laminating at least a luminescent layer and a cathode to inject electrons on the above film; a thin film transistor substrate comprising the above film as a substrate; and an organic EL element obtained by laminating the above luminescent layer and the above cathode on the thin film transistor substrate.

BACKGROUND OF THE INVENTION

Transparent electrically-conductive films, obtained by forming a transparent electrically-conductive thin film of tin oxide, indium oxide, indium-tin complex oxide, zinc oxide, etc., on a transparent polymeric film, are widely used for electro-optical devices such as a liquid crystal display element, an organic EL display element or a tranparent electrode of a touch panel.

As a transparent polymeric film to be used as a base material, for example, there is used polyethylene terephthalate or polycarbonate, as disclosed in JP-A-06-251632. However, since these films are insufficient in heat resistance, it is required to keep a process temperature for the production of a transparent electrically-conductive thin film low. When the temperature is kept low, a defect is that the crystallinity of the transparent electrically-conductive film decreases so that the surface resistivity of the film increases.

Further, as a constituent material for a plastic substrate having high heat resistance, there is partially used a polyarylate resin or a polyether sulfone resin, as disclosed in, for example, JP-A-06-044826. However, when a transparent electrically-conductive thin film is produced at a high temperature of 200° C. or higher, or when a thin film transistor (TFT) is formed in addition to the transparent electrically-conductive thin film, even the above-level heat-resistance is insufficient.

For example, an active matrix display device using a thin film transistor substrate obtained by forming a thin film transistor as a pixel-switching element on a glass substrate is adopted in recent years, since it can respond to the needs of upsizing, high-definition and high-intensity of a device. If a substrate of a plastic film can be adopted in place of a glass substrate, there can be obtained a thin, light and almost unbreakable display device. As a substrate for a passive matrix display device that does not use a thin film transistor, there have been already adopted transparent plastic films such as polyethylene terephthalate, polycarbonate or polyether sulfone, as disclosed in JP-A-9-169074 or JP-A-2001-52530.

However, concerning a general process of producing a thin film transistor, a temperature for forming a polycrystalline silicon film is a high temperature of at least 400° C. even in a low-temperature process and a temperature for forming an amorphous silicon film is also a high temperature of at least 250° C. In this case, the above conventionally-used transparent plastic films are insufficient in heat resistance. It is very difficult to obtain a thin film transistor substrate by forming a thin film transistor on a substrate of one of these films.

Further, JP-A-9-116158 discloses a method in which a thermal diffusion means is provided for preventing a temperature at the time of forming a silicon film from increasing. JP-A-10-270711 discloses a method in which a film-forming temperature is decreased by adopting a special method in a film-forming operation. According to these methods, it is possible to form a thin film transistor on a conventional plastic film substrate. However, each method uses a special technique so that a defect is that a high cost is required.

On the other hand, a polyimide resin is known as a resin excellent in heat resistance or dimensional stability. A wholly aromatic polyimide resin obtainable by a polycondensation reaction of an aromatic tetracarboxylic acid dianhydride and an aromatic diamine can be used at a high temperature of 400° C. or higher and it has excellent properties of small thermal expansion coefficient and high dimensional stability. Therefore, it has been used in various fields including an aerospace industry and an electronic industry as a raw material for a film to be used at high temperatures, a wire-coating, an adhesive or a coating composition. However, since such a wholly aromatic polyimide resin has a color of from light yellow to reddish brown, it is unsuitable for a base material for the transparent electrically-conductive film. Further, it is also unsuitable for a film base material for a thin film transistor substrate used for an active matrix display device.

SUMMARY OF THE INVENTION

It is an object of the present invention to provide a transparent electrically-conductive film excellent in transparency and heat resistance and small in surface resistivity, an organic EL element obtained by forming at least a luminescent layer and a cathode to inject electrons on the above film, a thin film transistor substrate comprising the above film as a substrate, and an organic EL element obtained by forming at least a luminescent layer and the same cathode as above on the above transistor substrate.

It is another object of the present invention to provide a thin film transistor substrate obtained by forming a thin film transistor on a substrate of a transparent plastic film by a general film-forming process, for obtaining a thin, light and almost-unbreakable active matrix display device at a low price.

According to the present invention, there is provided a transparent electrically-conductive film comprising a substrate made of an aliphatic polyimide having a repeating unit of the formula [I] and a transparent electrically-conductive thin film layer, the transparent electrically-conductive thin film layer being laminated on the substrate,

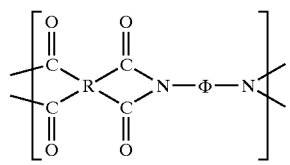

[I]

wherein R is a tetravalent aliphatic group having 4 to 39 carbon atoms and Φ is a divalent aliphatic group having 1 to 39 carbon atoms or a divalent aromatic group having 6 to 39 carbon atoms.

According to the present invention, further, there is provided a transparent electrically-conductive film comprising a substrate made of an aliphatic polyimide having a repeating unit of the formula [I], at least one gas barrier layer made of silicon oxide and/or silicon nitride and a transparent electrically-conductive thin film, the gas barrier layer and the transparent electrically-conductive thin film layer being laminated on the substrate.

According to the present invention, further, there is provided an organic EL element obtained by laminating at least a luminescent layer and a cathode to inject electrons on the transparent electrically-conductive film recited above.

According to the present invention, further, there is provided a thin-film transistor substrate comprising a substrate made of an aliphatic polyimide having a repeating unit of the formula [I] and a thin-film transistor, the thin film transistor being formed on the substrate made of the aliphatic polyimide.

According to the present invention, further, there is provided an organic EL element obtained by laminating at least a luminescent layer and a cathode to inject electrons on the thin-film transistor substrate recited above.

DETAILED DESCRIPTION OF THE INVENTION

Figure 1:
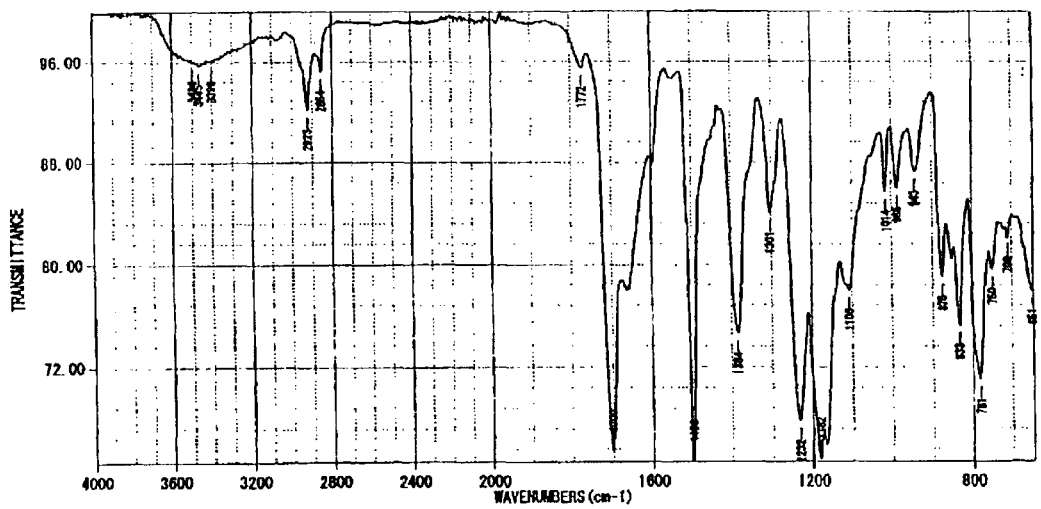
FIG. 1 shows the infrared absorption spectrum of a polyimide film obtained in Example 1.
Figure 2:
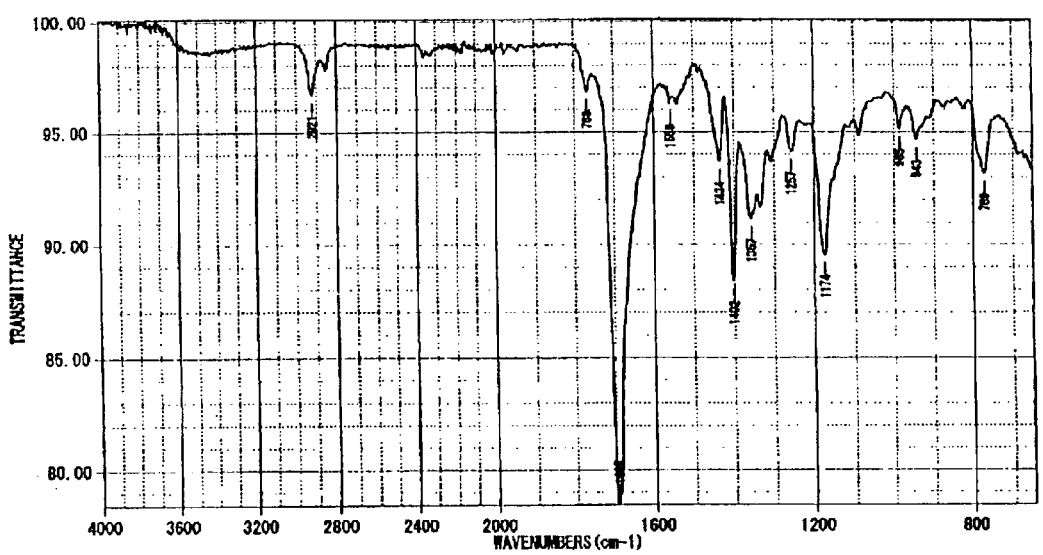
FIG. 2 shows the infrared absorption spectrum of a polyimide powder obtained in Example 2.

In the present invention, the term "aliphatic polyimide" refers to a polyimide compound represented by the formula [I].

The aliphatic polyimide of the formula [I] used in the present invention is a polyimide using a tetravalent aliphatic tetracarboxylic acid and a divalent diamine as components and it is obtainable by reacting an aliphatic tetracarboxylic acid or its derivative with a diamine or its derivative. The aliphatic tetracarboxylic acid or its derivative includes an aliphatic tetracarboxylic acid, aliphatic tetracarboxylic acid esters, and an aliphatic tetracarboxylic acid dianhydride. Preferred is aliphatic tetracarboxylic acid dianhydride and, particularly, an alicyclic tetracarboxylic acid dianhydride is preferred. The diamine or its derivative includes a diamine, diisocyanate and diaminodisilanes. Preferred is a diamine.

Examples of the aliphatic tetracarboxylic acid dianhydride used for the synthesis of the aliphatic polyimide of the present invention include 1,2,3,4-cyclobutanetetracarboxylic acid dianhydride, 1,2,4,5-cyclobutanetetracarboxylic acid dianhydride, 1,2,4,5-cyclobutanetetracarboxylic acid dianhydride and bicyclo[2,2,2]oct-7-ene-2,3,5,6-tetracarboxylic acid dianhydride. 1,2,4,5-cyclohexanetetracarboxylic acid dianhydride is particularly preferred.

Generally, it is difficult to polymerize a polyimide using an aliphatic diamine as a component, since polyamic acid as intermediate product and the diamine form a strong complex. Therefore, acontrivance is required, such as a use of a solvent, e.g. cresol, having a relatively high complex solubility. However, concerning a polyimide using 1,2,4,5-cyclobutanetetracarboxylic acid dianhydride and an apliphatic diamine as components, a bond of a complex of polyamic acid and the diamine is a relatively weak bond so that polymerization is easy and a flexible film is likely to be obtained.

The diamine used for the synthesis of the aliphatic polyimide of the pesent invention may be an aliphatic diamine, an aromatic diamine or a mixture of these. Preferred is an aliphatic diamine and, particularly, an alicyclic diamine is preferred. When the aliphatic diamine is used in combination with the aromatic diamine, a total light transmittance decreases with increasing the weight ratio of the aromatic diamine (A) to the aliphatic diamine (B). Therefore, the mixing weight ratio is preferably 3:1 (B:A) or less.

The aliphatic diamine (including alicyclic diamine) used for the synthesis of the aliphatic polyimide of the present invention includes, for example, ethylene diamine, hexamethylene diamine, polyethyleneglycolbis(3-aminopropyl)ether, polypropyleneglycolbis(3-aminopropyl)ether, 1,3-bis(aminomethyl)cyclohexane, 1,4-bis(aminomethyl)cyclohexane, metaxylylenediamine, paraxylylenediamine, isophoronediamine, norbornanediamine and siloxanediamines.

Further, the aromatic diamine used for the synthesis of the aliphatic polyimide of the present invention includes, for example, 4,4'-diaminodiphenylether, 4,4'-diaminodiphenylmethane, 4,4'-di-aminodiphenylsulfone, 2,2-bis(4-aminochenyl)propane, metaphenylenediamine, paraphenylenediamine, diaminobenzophenone, 2,6-diaminonaphthalene and 1,5-diaminonaphthalene.

For producing a polyimide resin used in the present invention, a solvent is used. Examples of the solvent include N-methyl-2-pyrolidone, N,N-dimethylacetoamide, N,N-dimethylformamide, dimethylsulfoxide, hexamethylphosphoramide, tetramethylenesulone, P-chlorophenol, m-cresol and 2-chloro-4-hydroxytoluene.

A polyimide film used in the present invention is produced by adding an acid dianhydride to a diamine solution or adding a diamine to an acid anhydride solution, keeping the resultant solution at a temperature of preferably 80° C. or lower, particularly approximately a room temperature or lower, to obtain a polyamic acid solution, applying the obtained solution to a surface of a substrate such as a glass plate or a metal plate, and heating it up to 200° C.~350° C. to carry out a dehydration reaction. Further, it can be produced by directly preparing a polyimide solution by any one of the following methods of (1) to (3), then applying the above solution to a surface of a substrate such as a glass plate or a metal plate, and heating it up to 200° C.~350° C. to evaporate the solvent.

(1) An azeotropic dehydration solvent such as toluene or xylene is added to a polyamic acid solution as an reaction intermediate and a dehydration reaction is carried out while removing a generated water from a system by azeotropy, thereby producing a polyimide solution.

(2) A polyamic acid solution as a reaction intermediate is imidized by using a dehydrating agent such as acetic acid anhydride, then a solvent having a low polyimide solubility such as methanol is added to the solution to precipitate polyimide, the precipitated polyimide is separated as a solid by filtration, washing and drying, and the separated polyimide is dissolved in a solvent such as N,N-dimethylacetoamide, to obtain a polyimide solution. For the imidization, a tertiary amine such as triethylamine, pyridine or β-picoline may be used in combination as a catalyst.

(3) A polyamic acid solution is prepared by using a high-boiling solvent such as cresol, the polyamic acid solution is kept at 150° C. or more as it is, to carry out imidization and form polyimide, then a solvent having a poor polyimide solubility such as methanol is added to the solution to precipitate polyimide, the precipitated polyimide is separated as a solid by filtration, washing and drying, and the separated polyimide is dissolved in a solvent such as N,N-dimethylacetoamide, to obtain a polyimide solution.

When the transparent electrically-conductive film is used for a display substrate for an organic EL or a liquid crystal display element, the film is required to have a low refractive index. When the refractive index of the film is high, the reflectance increases and the display performance extremely decreases. The refractive index of the polyimide film used in the present invention is 1.61 or less so that the polyimide film is suitable for a use as a plastic substrate for a display.

A known metal oxide film or the like may be used as a transparent electrically-conductive thin film layer in the present invention. Examples thereof include films of metal oxides such as indium oxide, cadmium oxide and tin oxide containing tin, tellurium, cadmium, molybdenum, tungsten, fluorine, zinc, germanium, etc., as impurities, and zinc oxide and titanium oxide containing aluminum as impurities. Of these, a thin film of indium oxide (ITO) containing 2 to 15% by weight of tin oxide is excellent in transparency and electric conductivity and is thus preferably used. Although the film thickness of the above transparent electrically-conductive thin film layer is set depending upon an intended surface resistance, it is preferably 5 nm to 10 $\mu$m. When the transparent electrically-conductive thin film layer is laminated on the polyimide film directly or through a barrier layer, there is adopted a vapor deposition method, such as a sputter method, a vacuum deposition method, an ion plating method or a plasma CVD method, in which a material is deposited from a vapor phase to form a film. To adjust a base material temperature at the film-forming time to 250° C. to 400° C., preferably 250° C. to 350° C., is required for adjusting the specific resistance of the transparent electrically-conductive thin film layer to 10 m$\Omega$·cm or less, preferably 1 m$\Omega$·cm or less. For this reason, it is preferred that the polyimide base material has a glass transition temperature of preferably 250° C. or higher.

The total light transmittance of the transparent electrically-conductive film is preferably 80% or higher.

When the transparent electrically-conductive film of the present invention is used as an electrode substrate for an organic EL element or a liquid crystal display element, it is preferred to form at least one gas barrier layer on the polyimide film. The gas barrier layer includes layers of metal oxides or metal nitrides comprising, as a main component, one metal or at least two metals selected from the group consisting of silicon, aluminum, magnesium and zinc. These materials are known as a material excellent in gas barrier properties. These oxide layers can be produced by, for example, a vapor deposition method, such as a sputter method, a vacuum deposition method, an ion plating method or a plasma CVD method, in which a material is deposited from a vapor phase to form a film. Concerning gas transmission rates of the transparent electrically-conductive film, the film preferably has an oxygen transmission rate, measured at 23° C. and at 60% RH, of 1.0 cc/m$^2$·day or less and a steam transmission rate, measured at 40° C. and at 90% RH, of 1.0 g/m$^2$·day. The layer thickness of the gas barrier layer is selected so as to satisfy the above properties. The layer thickness of the gas barrier layer is preferably 10 nm to 10 $\mu$m.

When the gas barrier layer, the transparent electrically-conductive thin film layer and the like are formed, cracks or peelings occur in some cases. For preventing the occurrences of these, a linear expansion coefficient at a temperature lower than a glass transition temperature of the aliphatic polyimide is preferably 45 ppm/° C. or less.

The thin film transistor of the present invention can be produced by a known method. A production example of an amorphous silicon thin film transistor will be shown hereinafter. First, a chrome film is formed on a polyimide substrate by a sputter method and then a gate electrode is formed by etching or the like. Then, a silicon nitride film as a gate insulator film is formed by a plasma CVD method. Then, an amorphous silicon film is formed by a plasma CVD method or the like. Then, dry etching is carried out to obtain a predetermined shape. Then, a chrome film is formed by a sputter method and then a source electrode and a drain electrode are formed by etching or the like. Then, unnecessary portions of the amorphous silicon film are removed by dry etching. Lastly, a silicon nitride film as a protective film is formed by a plasma CVD method, to obtain the amorphous silicon thin film transistor.

Although a polycrystalline silicon thin film transistor can be produced through the same steps as the above steps, a step, as an example, of crystallizing silicon by carrying out a laser annealing treatment is added after the formation of the amorphous silicon film.

Through the above steps, there can be obtained the thin film transistor substrate comprising a substrate of a transparent plastic film and, provided thereon, a thin film transistor.

EFFECT OF THE INVENTION

The transparent electrically-conductive film obtained according to the present invention is excellent in transparency and heat resistance and small in surface resistance and is used for an electro-optical device such as a transparent substrate of a liquid crystal display element or an organic EL display element and a tranparent electrode of a touch panel.

According to the present invention, there is provided a thin film transistor substrate obtained by forming a thin film transistor on a substrate of a transparent plastic film by a general film-forming process. The above thin film transistor substrate can be used for a thin, light and almost-unbreakable active matrix display device.

EXAMPLES

The present invention will be concretely explained with reference to Examples hereinafter, while the present invention shall not be limited by these Examples.

Production Example

Synthesis of 1,2,4,5-cyclohexanetracarboxylic acid dianhydride

A hastelloy (HC22) autoclave having a volume of 5 liters was charged with 552 g of pyromellitic acid, 200 g of a catalyst of an activated carbon supporting Rh (supplied by N.E. Chemcat Corporation) and 1,656 g of water, and the inside atmosphere of the reactor was replaced with a nitrogen gas with stirring. Then, the inside atmosphere of the reactor was replaced with a hydrogen gas, a hydrogen pressure in the reactor was adjusted at 5.0 MPa and the temperature was increased up to 60° C. While the hydrogen pressure was maintained at 5.0 MPa, the mixture was allowed to react for 2 hours. The hydrogen gas in the reactor was replaced with a nitrogen gas and the reaction mixture was drawn from the autoclave. The reaction mixture was thermally filtered to separate the catalyst. The filtrate was concentrated by distilling the water with a rotary evaporator under reduced pressure, to precipitate a crystal. The crystal was separated by solid-liquid separation at room temperature and the separated crystal was dried to obtain 481 g of 1,2,4,5-cyclohexanetracarboxylic acid (yield 85.0%)

Then, 450 g of the obtained 1,2,4,5-cyclohexanetracarboxylic acid and 4,000 g of acetic acid anhydride were placed in a 5-liter separable flask made of glass (with a Dimroth condenser tube), and the inside atmosphere of the reactor was replaced with a nitrogen gas with stirring. The temperature was increased up to a solvent reflux temperature under the nitrogen gas atmosphere, and then a solvent was refluxed for 10 minutes. The mixture was allowed to cool down to a room temperature while stirring, to precipitate a crystal. The above crystal was separated by solid-liquid separation and the separated crystal was dried to obtain a primary crystal. Further, the separation mother liquor was concentrated with a rotary evaporator under reduced pressure, to precipitate a crystal. This crystal was separated by solid-liquid separation and the separated crystal was dried to obtain a secondary crystal. The primary crystal and the secondary crystal were totaled, to obtain 375 g of 1,2,4,5-cyclohexanetracarboxylic acid dianhydride (anhydrization yield 96.6%)

Example 1

A 500-ml five-necked flask equipped with a thermometer, a stirrer, a nitrogen-introducing tube, a dropping funnel with a bypass tube and a condenser tube with a partial condenser was charged with 11.2 g (0.05 mol) of the 1,2,4,5-cyclohexanetracarboxylic acid dianhydride synthesized in the Production Example and 37.7 g of N-methyl-2-pyrolidone as a solvent, to obtain a solution. The thus-obtained solution was cooled to 5° C. by using an ice water bath. While maintaining the above temperature, a solution of 10.0 (0.05 mol) g of 4,4'-diaminodiphenylether in 40.0 g of N-methyl-2-pyrolidone was dropwise added from the dropping tube over 30 minutes. After the completion of the addition, the ice water bath was detached, and the mixture was stirred at room temperature for 2 hours. Then, 30.0 g of xylene as an azeotropic dehydration solvent was added, and the resultant mixture was temperature-increased to 170° C. The mixture was temperature-increased up to 200° C. over 4 hours while distillating a distillate, to finish the reaction. Air-cooling was carried out until the inside temperature of the flask became 60° C., and then the reaction mixture was taken out. The weight of this solution was 87.9 g, and the total weight of the distillate was 37.7 g. The obtained solution was applied to a glass plate and the applied solution was dried on a hotplate at 80° C. for 1 hour, to form a coating. Then, the coating was separated from the glass plate to obtain a self-supporting film. The film was fixed to a fixture made of stainless steel. The film fixed to the fixture was dried in a hot air dryer at 200° C. for 1 hour, to obtain a light-brown flexible film having a thickness of 100 μm. FIG. 1 shows IR spectrum of the above film. The generation of imide was confirmed according to ν (c=O) 1772, 1700 (cm$^{-1}$). Further, 0.5 g of the above film was dissolved in 10 ml of concentrated sulfuric acid and an inherent viscosity η was measured under a temperature condition of 30° C. The inherent viscosity η was 0.58. A glass transition temperature was measured with DSC and the glass transition temperature was 315° C.

Further, the above film had a light-brown color. The film was measured for a total light transmittance with a haze meter (supplied by NIPPON DENSHOKU INDUSTRIES CO., LTD., Z-Σ80) according to JIS K7105 and it showed a high total light transmittance of 89%.

A silicon oxide layer having a thickness of 500 nm was formed on the obtained polyimide film by a sputter method, and an indium oxide.tin (ITO, In:Sn=9:1) layer having a thickness of 100 nm was formed thereon to obtain a transparent electrically-conductive film.

Example 2

11.2 g (0.05 mol) of the 1,2,4,5-cyclohexanetracarboxylic acid dianhydride synthesized in the Production Example, 7.1 g (0.05 mol) 1,4-bis(aminomethyl)cyclohexane and 60 g of m-cresol as a solvent were added to the same 500-mL five-necked flask as that used in Example 1, to obtain a solution, and the solution was temperature-increased up to 100° C. The solution was stirred for 4 hours at the above temperature, then, the solution was further temperature-increased up to approximately 200° C., and the solution was allowed to react under reflux for 4 hours, to finish the reaction. The reaction solution was cooled to room temperature and then the reaction solution was poured to 1,000 ml of methanol, to precipitate a polymer. The polymer was recovered by filtration and then washed with methanol. Then, the washed polymer was dried in a dryer at 100° C. for 24 hours, to obtain 9.58 g of a white powder (yield 96.8%). Table 2 shows IR spectrum of the powder. The generation of imide was confirmed according to ν (c=O) 1768, 1695 (cm$^{-1}$). Further, 0.5 g of the above powder was dissolved in 10 ml of concentrated sulfuric acid and measured for an inherent viscosity η under a temperature condition of 30° C. The inherent viscosity η was 0.44. The powder was measured for a glass transition temperature with DSC and it was 256° C. It was confirmed that the powder was soluble in dimethylformamide or N-methyl-2-pyrolidone.

5 g of the obtained polyimide powder was dissolved in 25 g of N-methyl-pyrolidone to obtain a solution. The solution was applied to a glass plate and the applied solution was dried on a hotplate at 80° C. for 1 hour, to form a coating. Then, the coating was separated from the glass plate to obtain a self-supporting film. The film was fixed to a fixture made of stainless steel. The film fixed to the fixture was dried in a hot air dryer at 200° C. for 1 hour, to obtain a colorless, transparent flexible film having a thickness of 100 μm. A silicon oxide layer having a thickness of 500 nm was formed on the obtained polyimide film by a sputter method, and an indium oxide.tin (ITO, In:Sn=9:1) layer having a thickness of 100 nm was formed thereon to obtain a transparent electrically-conductive film.

Comparative Example 1

10.0 g (0.05 mol) of 4,4'-diaminodiphenylether and 37.7 g of dimethylacetoamide as a solvent were added to the same 500-mL five-necked flask as that used in Example 1 to obtain a solution. 10.9 g (0.05 mol) of pyromellitic acid dianhydride in a solid state was added to the above solution under a nitrogen current at room temperature over approximately 1 hour. After the completion of the addition, the resultant mixture was stirred at room temperature for 3 hours to obtain a polyamic acid solution. The obtained solution was applied to a glass plate and the applied solution was dried on a hotplate at 50° C. for 1 hour, to form a coating. Then, the coating was separated from the glass plate to obtain a self-supporting film. The film was fixed to a fixture made of stainless steel. The film fixed to the fixture was dried in a hot air dryer at 100° C. for 3 hours, at 200° C. for 3 hours, at 250° C. for 2 hours, at 300° C. for 1 hour, and then at 400° C. for 1 hour, to obtain a brown flexible film having a thickness of 100 μm. An indium oxide.tin (ITO, In:Sn=9:1) layer having a thickness of 100 nm was formed on the obtained polyimide film by a sputter method to obtain a transparent electrically-conductive film.

Comparative Example 2

An indium oxide e tin (ITO, In:Sn=9:1) layer having a thickness of 100 nm was formed on a PET film (supplied by Toray Industries, Inc., Lumirror #100) having a thickness of 100 μm by a sputter method to obtain a transparent electrically-conductive film.

The transparent electrically-conductive films obtained in Examples and Comparative Examples were evaluated as follows.

<Glass transition temperature> DSC measurements were carried out using a differential scanning calorimeter (DSC-50), supplied by SHIMADZU CORPORATION, under a condition of a temperature-increasing speed of 10° C./minute, to obtain glass transition temperatures.

<Refractive index> The films were measured for a refractive index at 23° C. with a refractometer, (DR-M2) supplied by ATAGO Co., Ltd., set with a 589 nm interference filter.

<Total light transmittance> The films were measured for a total light transmittance with a haze meter (supplied by NIPPON DENSHOKU INDUSTRIES CO., LTD., Z-Σ80) according to JIS K7105.

<Surface resistivity> The films were measured for a surface resistivity by a 4-terminal method according to JIS K7194. Lotest AMCP-T400, supplied by Mistubishi-Yuka K. K., was used as a measuring device.

<Oxygen transmission rate> The films were measured for an oxygen transmission rate with an oxygen transmission rate measuring device (supplied by Modern control, OX-TRAN10/50A) at 23° C. at a relative humidity of 60% according to JIS K7126.

<Steam transmission rate> The films were measured for a steam transmission rate at 40° C. at a relative humidity of 90% according to JIS Z0208.

TABLE 1

| Substrate structure (acid anhydride/ diamine) | Example 1 CTDA/ DDE | Example 2 CTDA/ 1,4- BAC | Comparative Example 1 PMDA/DDE | Comparative Example 2 PET |
| --- | --- | --- | --- | --- |
| Film thickness (μm) | 100 | 100 | 100 | 100 |
| Gas barrier layer thickness (nm) | 500 | 500 | 0 | 0 |
| Electrically-conductive layer thickness (nm) | 100 | 100 | 100 | 100 |
| Oxygen transmission rate (cc/m² · day · atm) | 0.5 | 0.5 | 10 | 12 |
| Steam transmission rate (g/m² · day · atm) | 0.7 | 0.7 | 5 | 6 |
| Total light transmittance (%) | 89 | 90 | 65 | 84 |
| Substrate temperature at the time of forming an electrically-conductive layer (° C.) | 300 | 250 | 300 | — |
| Specific resistance of electrically-conductive layer (mΩ · cm) | 0.6 | 1 | 0.6 | — |
| Reflective index | 1.602 | 1.536 | 1.784 | 1.660 |
| Glass transition temperature (° C.) | 315 | 356 | >400 | 81 |
| Linear expansion coefficient (ppm/° C.) | 39 | 42 | 20 | 15 |

CTDA: cyclohexanetetracarboxylic acid dianhydride
PMDA: pyromellitic acid dianhydride
DDE: 4,4'-diaminodiphenylether
BAC: bis (aminomethyl) cyclohexane

Example 3

Figure 3:
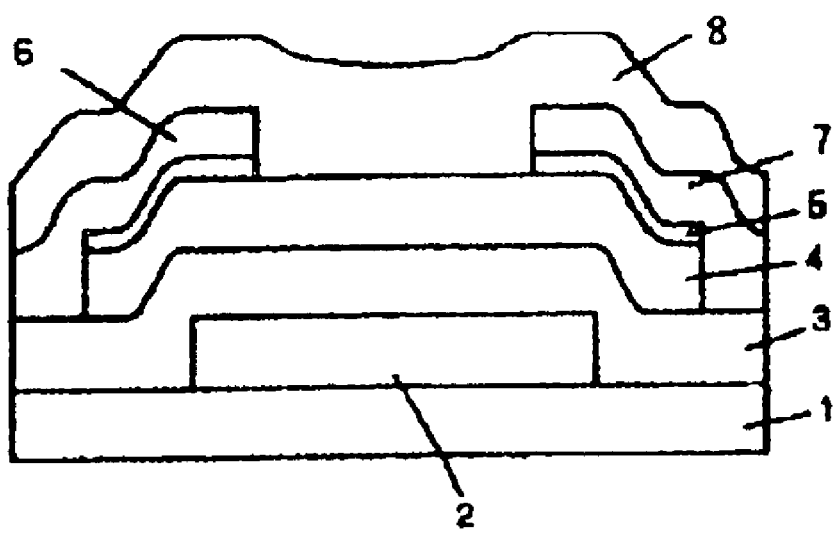
FIG. 3 is an explanatory drawing showing a thin film transistor substrate.

A chrome film having a thickness of 300 nm was formed on the same polyimide film (FIG. 3, 1) having a thickness of 100 μm as obtained in Example 1 by a sputter method. After carrying out a photographic treatment, a gate electrode (FIG. 3, 2) having a predetermined shape was formed by etching. Then, a silicon nitride film having a thickness of 300 nm was formed as a gate insulator film (FIG. 3, 3) by a plasma CVD method. Then, a high-resistant amorphous silicon film (FIG. 3, 4) having a thickness of 120 nm was formed by a plasma CVD method and a low-resistant amorphous silicon film (FIG. 3, 5) having a thickness of 30 nm was formed thereon. After carrying out a photographic treatment, dry etching was carried out to obtain a silicon film having a predetermined shape. Then, a chrome film having a thickness of 40 nm was formed by a sputter method and then etching was carried out to form a source electrode (FIG. 3, 6) and a drain electrode (FIG. 3, 7). Then, dry etching was carried out to remove the low-resistant amorphous silicon film between the source electrode and the drain electrode. Then, a silicon nitride film having a thickness of 500 nm was formed by a plasma CVD method, and after carrying out a photographic treatment, dry etching was carried out to form a protective film having a predetermined shape and an insulator film (FIG. 3, 8). By the above steps, there could be obtained a visible-light-transmitting thin film transistor substrate having polyimide film substrate and, formed thereon, an amorphous silicon thin film transistor.

What is claimed is:

1. A transparent electrically-conductive film comprising a substrate and a transparent, electrically conductive thin film layer being laminated on the substrate, wherein the substrate consists essentially of an aliphatic polyimide having a repeating unit of the formula (I),

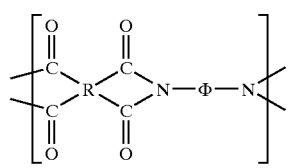

[I]

wherein R is a tetravalent aliphatic group having 4 to 39 carbon atoms and Φ is a divalent aliphatie group having 1 to 39 carbon atoms or a divalent aromatic group having 6 to 39 carbon atoms.

2. The transparent electrically-conductive film according to claim 1, wherein at least one gas barrier layer made of at least one member selected from the group consisting of silicon oxide, silicon nitride and a mixture thereof is further formed on the substrate made of the aliphatic polyimide having a repeating unit of the formula (I).

3. The transparent electrically-conductive film according to claim 1, wherein the aliphatic polyimide having a repeating unit of the formula (I) has a glass transition temperature of 250° C. or higher.

4. The transparent electrically-conductive film according to claim 1, wherein a linear expansion coefficient at a temperature lower than a glass transition temperature of the aliphatic polyimide having a repeating unit of the formula (I) is 45 ppm/° C. or less.

5. The transparent electrically-conductive film according to claim 1, which has a total light transmittance of 80% or higher.

6. The transparent electrically-conductive film according to claim 1, wherein the transparent electrically conductive thin film layer has a specific resistance of 10 mΩ·cm or less.

7. The transparent electrically-conductive film according to claim 1, wherein the transparent electrically-conductive thin film layer has an oxygen transmission rate, measured at 23° C. and at 60% RH, of 1 cc/m²·day or less and a steam transmission rate, measured at 40° C. and at 90% RH, of 1.0 g/m²·day.

8. The transparent electrically-conductive film according to claim 1, wherein R in the formula (I) is a cyclohexane ring.

9. An organic EL element obtained by laminating at least a luminescent layer and a cathode to inject electrons on the transparent electrically-conductive film recited in claim 1.

10. A thin-film transistor substrate comprising a substrate consisting essentially of a film of a polyimide having a repeating unit of the formula (I) and a thin-film transistor, the thin film transistor being formed on a substrate consisting essentially of the film of the polyimide,

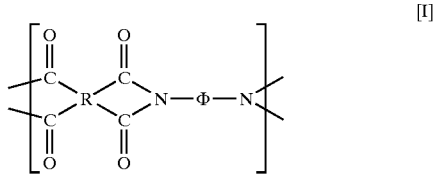

wherein R is a tetravalent aliphatic group having 4 to 39 carbon atoms and Φ is a divalent aliphatic group having 1 to 39 carbon atoms or a divalent aromatic group having 6 to 39 carbon atoms.

11. An organic EL element obtained by laminating at least a luminescent layer and a cathode to inject electrons on the thin-film transistor substrate recited in claim 10.

* * * * *